(12) United States Patent
Arias et al.

(10) Patent No.: US 8,741,536 B2
(45) Date of Patent: Jun. 3, 2014

(54) LIGHT SENSITIVE COATING COMPOSITIONS USEFUL FOR LITHOGRAPHIC ELEMENTS

(75) Inventors: André Luiz Arias, Rio de Janeiro (BR); Luiz Nel Arias, Rio de Janeiro (BR); Marjorie Arias, Rio de Janeiro (BR); Mario Italo Provenzano, Rio de Janeiro (BR)

(73) Assignee: IBF Industria Basileira de Filmes S/A, Rio de Janeiro (BR)

( * ) Notice: Subject to any disclaimer, the term of this patent is extended or adjusted under 35 U.S.C. 154(b) by 0 days.

(21) Appl. No.: 10/573,368

(22) PCT Filed: Sep. 24, 2003

(86) PCT No.: PCT/BR03/00137
§ 371 (c)(1), (2), (4) Date: Nov. 6, 2006

(87) PCT Pub. No.: WO2005/029186
PCT Pub. Date: Mar. 31, 2005

(65) Prior Publication Data
US 2007/0202434 A1   Aug. 30, 2007

(51) Int. Cl.
*G03F 7/004* (2006.01)
*G03F 7/027* (2006.01)
*G03F 7/029* (2006.01)
*G03F 7/11* (2006.01)
*G03F 7/26* (2006.01)
*B41N 1/08* (2006.01)

(52) U.S. Cl.
USPC ............... 430/270.1; 430/273.1; 430/281.1; 430/302; 101/453; 101/463.1

(58) Field of Classification Search
USPC ........ 430/270.1, 300, 302, 273.1, 281.1, 908, 430/919, 921, 922, 925, 287.1; 101/453, 101/463.1
See application file for complete search history.

(56) References Cited

U.S. PATENT DOCUMENTS

| | | | | |
|---|---|---|---|---|
| 4,053,316 | A | * | 10/1977 | Lu ................................ 522/24 |
| 4,772,538 | A | * | 9/1988 | Walls et al. ................. 430/284.1 |
| 4,877,711 | A | * | 10/1989 | Aoai et al. ..................... 430/176 |
| 5,691,394 | A | * | 11/1997 | Kondo ............................ 522/29 |
| 5,908,734 | A | | 6/1999 | Okui et al. |
| 5,912,105 | A | | 6/1999 | Haberhauer et al. |
| 5,922,508 | A | | 7/1999 | Zertani et al. |
| 6,232,038 | B1 | | 5/2001 | Takasaki et al. |
| 6,514,668 | B1 | | 2/2003 | Tsuji et al. |
| 2001/0018164 | A1 | | 8/2001 | Furukawa |
| 2002/0142249 | A1 | * | 10/2002 | Ohshima ..................... 430/283.1 |
| 2002/0182563 | A1 | * | 12/2002 | Boutoussov et al. ........... 433/29 |
| 2003/0017411 | A1 | * | 1/2003 | Shimada et al. ........... 430/270.1 |
| 2003/0129504 | A1 | * | 7/2003 | Wakata et al. .................... 430/5 |
| 2003/0165777 | A1 | * | 9/2003 | Teng ............................. 430/292 |
| 2004/0091812 | A1 | * | 5/2004 | Huang et al. .............. 430/270.1 |

FOREIGN PATENT DOCUMENTS

| | | | |
|---|---|---|---|
| EP | 0 484 752 | * | 5/1992 |
| EP | 0 684 522 | | 11/1995 |
| JP | 09-236913 | * | 9/1997 |

OTHER PUBLICATIONS

"BASF colorants for printing inks.Quality and service. Worldwide", published by BASF, 7 pages, date unknown.*
Machine translation of JP 09-236913, published on Sep. 9, 1997.*
International Search Report for PCT/BR2003/000137 completed Jun. 18, 2004.

* cited by examiner

*Primary Examiner* — Anca Eoff
(74) *Attorney, Agent, or Firm* — Alston & Bird LLP

(57) ABSTRACT

A radiation sensitive composition which is primarily sensitive in the near UV and visible region of the electromagnetic spectrum is composed of a polymeric binder, an ethylenically unsaturated monomer, a radiation absorbing compound, a photoaccelerator, an onium compound, and an adhesion promoter, which are overcoated with an oxygen barrier layer. When applied to the proper support and processed, the composition is useful as an offset lithographic printing plate, color proofing film or image resist.

43 Claims, No Drawings

LIGHT SENSITIVE COATING COMPOSITIONS USEFUL FOR LITHOGRAPHIC ELEMENTS

BACKGROUND

1. Field of the Invention

The invention relates to light sensitive coating compositions useful for the preparation of lithographic printing plates, color proofing films, resists and the like.

2. Description of Related Art

The art of lithographic printing is based upon the immiscibility of oil and water, wherein the oily material or ink is preferentially retained by the image area and the water or fountain solution is preferentially retained by the non-image area. When a suitably prepared surface is moistened with water and ink is applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion, which is exposed become soluble so that it is removed in the developing process. Such a plate is referred to as positive-working. Conversely, when that portion of the coating which becomes exposed becomes hardened, the plate is referred to as negative working. In both instances, the image area remaining is ink-receptive or oleophilic and the non-image area or background is water receptive or hydrophilic. The differentiation between image and non-image areas is made in the exposure process where a film is applied to the plate with a vacuum to insure good contact. The plate is then exposed to a light or energy source. The light source may be primarily in the UV, visible or IR portions of the electromagnetic spectrum. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image is clear while the non-image area is opaque. The coating under the clear area of the film is hardened by the action of light while the area not struck by light is removed. The light hardened surface of a negative plate is therefore oleophilic and will accept ink while the non-image area which has had the coating removed through the action of a developer is desensitized and is therefore hydrophilic.

Direct digital imaging of offset printing plates has become increasingly important in the printing industry. Advances in solid-state laser technology have made medium to high powered diode lasers attractive energy sources for platesetters, particularly lasers emitting energy in the blue region of the visible spectrum (400-410 nm) although imaging at other wavelengths may advantageously be performed such as 488 nm and 532 nm. The use of controlled laser exposure obviates the need to use a film or mask when making image exposures, thereby facilitating a platemaking operation.

There are a number of United States patents relating to imaging compositions sensitive to various wavelengths in the visible and near UV regions of the electromagnetic spectrum which contain binder resins, ethylenically unsaturated monomers, photoinitiators and are negative working. A negative working plate based upon a single photosensitive layer using an ethylenically unsaturated monomer which is a phosphate compound having at least one (meth)acryloyl group, photopolymerization initiator and a polymeric binder is disclosed in U.S. Pat. No. 6,514,668. U.S. Pat. No. 6,232,038 discloses a photosensitive composition comprising an ethylenically unsaturated bond-containing compound, a sensitizing dye and a photopolymerization initiator which is either a boron complex or halomethyl group containing compound. Disclosed in U.S. Pat. No. 5,922,508 is a dual layer system wherein the first layer is photopolymerizable and comprised of a binder, photoreducible dye, photopolymerizable initiator and an ethylenically unsaturated monomer having at least one unsaturated group and one photooxidizable group. This coating is overcoated with a polymer/dye combination which has a window of transparency between 300 and 700 nm but is opaque between 350 and 400 nm. U.S. Pat. No. 5,912,105 discloses a dual coated product wherein the first layer is photosensitive and contains a polymeric binder, a polymerizable compound with at least two unsaturated groups and a free radical generating initiating system. It is overcoated with an oxygen barrier layer.

One of the problems associated with these and similar systems is that often there is insufficient integrity of the image areas remaining after development of the printing plate to effectively perform the printing process over long printing runs, thereby resulting in print images having less than desired resolution and print quality. Another problem is that at certain wavelengths (i.e. 400-410 nm), the photospeed required of the plate is very high. Lasers in this region have a low effective output thereby requiring that the plate have inherently greater photospeed. It can be difficult to have a plate product able to satisfactorily be imaged at such low power levels.

The object of the present invention is to provide an element capable of providing long runs, while having high resolution and high photosensitivity.

SUMMARY OF THE INVENTION

The invention provides a radiation sensitive material useful for the preparation of an imaging layer on a support which is capable of functioning in a negative-working manner, said material consisting of a substrate and two layers (1) and (2) built thereon. The first layer (1) is a composition comprising a mixture of: (a) a polymeric binder, (b) an ethylenically unsaturated monomer having functionality of three or more, (c) a radiation absorbing compound, (d) a photoaccelerator, (e) an onium compound and (f) an adhesion promoter. The second layer (2) is comprised of a slight to non-oxygen permeable polymer.

The invention also provides a process for preparing an image comprising (i) providing an imaging layer coated on a support material, said imaging layer comprising a mixture of (a) a polymeric binder, (b) an ethylenically unsaturated monomer having functionality of three or more, (c) a radiation absorbing compound, (d) a photoaccelerator, (e) an onium compound, and (f) an adhesion promoter, (ii) on overcoated layer acting as an oxygen barrier layer, (iii) imagewise exposing said imaging area to an energy source emitting a laser beam of sufficient energy to at least partially insolublize the irradiated area and form an exposed latent image, (iv) treat the exposed plate with heat of sufficient time and temperature to complete the reaction and form a fully insolubilize image, and (v) contacting said image area with developer material wherein the unexposed areas of said imaging layer are selectively removed from said support.

The radiation sensitive compositions of this invention may be applied to various substrates to form photosensitive elements. If applied to a textured and anodized aluminum plate, the coated plate may be used as a planographic (lithographic) printing plate capable of printing thousands of high quality, high resolution images. If the composition is applied to a transparent film support, eg, a polyester film, it may be advantageously used as a film for color proofing. The composition may also be used as a photoresist for making printed circuits.

DETAILED DESCRIPTION OF THE INVENTION

The present invention describes a photopolymerizable imaging material and a process for the production of a printing plate precursor for offset printing with the use of this material. The material according to the invention consists of 1) a substrate, 2) a photopolymerizable layer which is crosslinkable by means of free radicals and cationic species and is sensitive to radiation in the near UV and in the visible range but not very sensitive to radiation in the infrared region, and 3) a layer which is transparent to radiation in the near UV and visible range, only slightly permeable to oxygen.

It is an object of the present invention to provide a photosensitive coating composition for direct imaging by laser or laser diode, which 1) has high sensitivity to a laser energy source emitting in the near UV and visible electromagnetic spectrum, 2) can easily be handled under conventional yellow light without requiring any special environment such as red light, 3) can be developed with an aqueous alkaline developer, and 4) has stability for long term storage before use. It is further an object of the present invention to improve the sensitivity of photopolymerizable layers, in particular of materials for the production of printing plates, without a simultaneous reduction in resolution. The improved photsensitivity should be accomplished through the balance of a radiation sensitive compound, a photoaccelerator and an onium compound. In particular it has been found that the ratio of accelerator and onium salt can be advantageously employed to achieve a very high level of sensitivity. The ratio of accelerator to onium salt is of the order of 20:1 more preferred is 15:1 and most preferred is 8:1.

Other objects, features and advantages of the present invention will become apparent to those skilled in the art from the following detailed description. It should be understood, however, that the detailed description and preferred examples, while indicating preferred embodiments of the present invention, are given by way of illustration and not limitation. Many changes and modifications within the scope of the present invention may be made without departing from the spirit thereof, and the invention includes all such modification.

The polymeric binders used in the present invention are minimally copolymers of (meth)acrylic acid with alkyl(meth)acrylates, alkenyl(meth)acrylates, aryl(meth)acrylates, alkylaryl(meth)acrylates, (meth)acrylonitrile or the like;

terpolymers of (meth)acrylic acid with alkyl(meth)acrylates, alkenyl(meth)acrylates, aryl(meth)acrylates, alkylaryl(meth)acrylates, (meth)acrylonitrile, styrene and optionally substituted styrenes, vinyl acetate or the like;

tetra or pentapolymers of (meth)acrylic acid with alkyl(meth)acrylates, alkenyl(meth)acrylates, aryl(meth)acrylates, alkylaryl(meth)acrylates, (meth)acrylonitrile, styrene and optionally substituted styrenes, vinyl acetate or the like;

copolymers of vinylacetic acid with alkyl(meth)acrylates and/or alkenyl(meth)acrylates;

Products of esterification of polymers containing hydroxyl groups with anhydrides of di- or polycarboxylic acids such as copolymers of hydroxyalkyl(meth)acrylates with (meth)acrylic acid, alkyl(meth)acrylates, alkenyl(meth)acrylates, aryl(meth)acrylates, alkylaryl(meth)acrylates, (meth)acrylonitrile, styrene and optionally substituted styrenes, vinyl acetate or the like; and products of esterification of polymers containing hydroxyl groups with acid chlorides such as copolymers of hydroxyalkyl(meth)acrylates with (meth)acrylic acid, alkyl(meth)acrylates, alkenyl(meth)acrylates, aryl(meth)acrylates, alkylaryl(meth)acrylates, (meth)acrylonitrile, styrene and optionally substituted styrenes, vinyl acetate or the like.

In general, the polymeric binders which may be used are polyalkyl(meth)acrylates in which the alkyl group is, for example, methyl, ethyl, isopropyl, n-propyl, isobutyl, n-butyl, n-hexyl, 2-ethylhexyl, and the like.

Particularly suitable binders are those which are insoluble in water, soluble in organic solvents, and partially soluble or swellable in aqueous alkaline solutions. Binders which contain hydroxyalkyl(meth)acrylates are very useful when further esterified with anhydrides such as crotonic anhydride, maleic anhydride, itaconic anhydride, and the like, and when esterified with acid chlorides such as acryloyl chloride, methacryloyl chloride, cinnamoyl chloride, and the like.

The polymers described above are particularly useful when the molecular weight is between 1000 and 300,000, more preferred between 5,000 and 200,000 and most preferred between 10,000 and 120,000. It is preferred that the acid number is between 5 and 300, more preferred between 10 and 250 and most preferred between 25 and 175.

The amount of polymeric binder in the photopolymer layer is preferred to be between 10% to 80%, more preferred is 15% to 70% and most preferred is between 20% and 55%.

The ethylenically unsaturated monomers are acrylates and methacrylates of trihydric or polyhydric aliphatic alcohols. Particularly suitable monomers are those derived from trimethylol propane, pentaerylthritol, dipentaerythritol, and the like. Preferred derivatives are esters of methacrylates. Most preferred derivatives are esters of acrylates, due to the slight improvement in photospeed. One or more of the polyfunctional acrylates or methacrylates may be advantageously blended together to achieve various performance features. Also, where photospeed is not the primary objective, a polyfunctional monomer may be advantageously admixed with mono- and difunctional acrylates and methacrylates to achieve various performance features.

The polyfunctional monomer(s) are preferred to be between 5% and 85%, more preferred is between 15% and 70%, and most preferred is between 25% and 60%.

The radiation absorbing compound is capable of generating free radicals under the influence of radiation in the near UV or visible region of the electromagnetic spectrum. A preferred class of absorbing compounds is generally referred to as titanocene. Specific examples of such compounds are dicyclopentadienyl-Ti-dichloride, dicyclopentadienyl-Ti-bisphenyl, dicyclopen-tadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-tetrafluorophen-1-yl, dicyclopentadienyl-Ti-bis-2,6-difluorophen-1-yl, dicyclopentadienyl-Ti-bis-2,4-difluorophen-1-yl, dicyclopentadienyl-Ti-bis-(2,6-difluoro-3-(pyrr-1-yl)phen-1-yl), dimethylcyclopentadienyl-Ti-bis-2,3,4,5,6-15 pentafluorophen-1-yl and dimethylcyclopentadienyl-Ti-bis-2,6-15-difluorophen-1-yl.

Another useful class of compounds is hexaarylbiimidazoles. Specific examples of such compounds are 2,2'-bis(o-chlorophenyl)4,4',5,5',-tetra(p-fluorophenyl)biimidazole, 2,2'-bis(o-chlorophenyl)-4,4',5,5',-tetra(p-chlorophenyl)biimidazole, 2,2'-bis(o-chlorophenyl)-4,4',5,5',-tetra(o-chlorophenyl)biimidazole, 2,2'-bis(o-chlorophenyl)-4,4',5,5',-tetra(o,p-dichlorophenyl)biimidazole, and 2,2'-bis(o-chlorophenyl)-4,4',5,5',-tetra(o,p-dibromophenyl) biimidazole.

Another useful class of radiation absorbing compound is the halomethyl substituted triazines. Specific examples of this class are tris-trichlormethyl-s-triazine, bis-trichloromethyl-s-triazine, tris-trifluoromethyl-s-triazine, and the like.

The radiation compound is preferred to be between 1% and 25%, more preferred is 3% and 20% and most preferred is between 5 and 15%.

The photoaccelerator accelerator acts in combination with the radiation absorbing compound and onium salt to enhance the photospeed. Examples of photoaccelerators include, but are not restricted to hexamethylene tetraamine, zinc diethyl dithiocarbamate, zinc ethyl phenyl dithiocarbamate, zinc dibenzyl dithiocarbamate, diphenyl guandine, dibenothiazyl disulfide, 2-mercaptobenzothiazole, benzothiazyl-2-cyclo hexyl sulfenamide, benzothiazyl-2-sulphene morpholide, dimethyl diphenylthiuram disulfide, tetramethyl thiuram disulfide, 2-mercaptobenzimidazole, 2-mercapto-5-methyl-benzimidazole, 2-mercaptobenzoxazole, 2-mercapto-4(3H)-quinazolinone, and the condensation product of butyraldehyde and aniline.

The photoaccelerator compound is preferred to be between 0.1% and 15%, more preferred is 0.5% and 10% and most preferred is between 1 and 8%.

The onium compound acts in union with the photoaccelerator and radiation absorbing compound to enhance the photospeed. The general classes are ammonium, arsonium, bismuthonium, bromonium, chloronium, diazonium, fluoronium, iodonium, oxonium, phosphonium, selenonium, stilonium, sulfonium and telluronium. Compounds within each group work somewhat. The most useful are iodonium, diazonium, and sulfonium. Specific examples of useful compounds include but are not limited to 3-methoxy-4-diazo hexafluorophosphate, are 3-methoxy-4-diazo hexafluoroantimonate, diphenyl iodonium chloride, diphenyl iodonium hexafluorophosphate, diphenyl iodonium hexafluoroantimonate, bis(4-t-butylphenyl)hexafluorophosphate, bis(4-methylphenyl) hexafluoroantimonate, triaryl sulfonium hexafluoroantimonate, triaryl sulfonium hexafluorophosphate, [4-[(2-hydroxytetradecyl)oxy]phenyl]phenyliodonium hexafluoroantimonate, and the like.

The onium compound is preferred to be between 0.01% and 8%, more preferred is 0.05% and 5% and most preferred is between 0.1 and 3%.

The adhesion promoter reacts with the coating and also the substrate to help anchor the light sensitive layer to the substrate. This provides for longer running coatings with higher apparent photospeed. The prefer red adhesion promoters are functionalized silanes or siloxanes. Specific examples of adhesion promoters include but are not limited to 3-aminopropyltriethoxy silane, vinyltriethoxy silane, N-2-aminoethyl-3-aminopropyltrimethoxy silane, triethylchloro silane, methacryloxypropyl trimethoxy silane, methyltriethoxy silane, octyltriethoxy silane, triethylchloro silane, chloromethyltrimethyl silane, and the like.

The adhesion promoter is preferred to be between 1% and 35%, more preferred is between 5% and 30% and most preferred is between 10 and 25%.

The light sensitive photopolymer coating is applied out of an organic solvent or solvents. The solvents used need only be solvents for all the components and are not critical to the proper functioning of the coating. The selection of solvents is more governed by the coating equipment, rolls, dryers and other elements readily recognized by one skilled in the art. The coating weight remaining after the solvents are removed in the drying process is preferred to be between 0.5 g/M$^2$ and 3.0 g/M$^2$, more preferred is be between 0.8 g/M$^2$ and 2.5 g/M$^2$, and most preferred is between 1.0 g/M$^2$ and 2.0 g/M$^2$ In addition to the preferred embodiments, the composition may optionally, but advantageously contain stabilizers, photoactivators, colorants, rheology modifiers and additives for giving a visible image upon exposure.

The foregoing describes the photosensitive coating. The coating applied to the substrate is then overcoated with an oxygen barrier layer. The barrier layer is to be essentially non-permeable to oxygen. Oxygen will quench the free radicals and therefore prevent any effective reaction from occurring, which would prevent insolubilization of the photopolymer coating. This is to be avoided. The barrier layer is preferred to be applied out of water or a water/organic solvent mixture. The polymer used to form the film is preferred to be highly or essentially water soluble since the film is removed after exposure with a water rinse and before development. Polymers that may be useful include but are not restricted to gelatin, gum arabic, polyvinylether/maleic anhydride colpolymers, polyvinyl methyl ether, polyvinyl alcohol, methyl cellulose, hydroxyethyl cellulose, polycarboxylic acid and the like. From the group listed, the preferred polymer is polyvinyl alcohol. Polyvinyl alcohol is provided as partially hydrolyzed, fully hydrolyzed and super hydrolyzed. In moving from the partially hydrolyzed to super hydrolyzed, water solubility is reduced. It is therefore preferred to use partially hydrolyzed or a combination of partially and fully hydrolyzed polyvinyl alcohol. The preferred ratio of partially to fully hydrolyzed is 20% to 80%, more preferred is 30% to 70% and most preferred is 45% to 55%. The molecular weight of a polymer used to create a barrier layer is preferred to be between 500 and 150,000, more preferred is 1,000 and 100,000 and most preferred is between 2,000 and 70,000.

The film forming polymer may be coated out of water only or a mixture of water and a low boiling solvent. This is not so important to the performance of the product, but more to the method of coating and drying. The coating weight remaining after the solvent(s) is removed in the drying process is preferred to be between 1.0 g/M$^2$ and 5.0 g/M$^2$, more preferred is be between 1.5 g/M$^2$ and 4.0 g/M$^2$, and most preferred is between 2.0 g/M$^2$ and 3.0 g/M$^2$.

A plate prepared with the light sensitive coating and barrier overcoat as described above is applied to a substrate. The substrate may be film, paper, metal or a composite. The present invention is primarily directed to offset planographic lithographic printing plates. The most common substrate is aluminum. When aluminum is used it must be treated with a variety of processes to yield a suitable carrier for the light sensitive coating.

Aluminum must be cleaned to remove mill oils. Common cleaning agents are aqueous alkaline detergent systems as well as solvents. Upon rinsing the surface must be roughened to increased the surface area. Roughening may be achieved through mechanical graining, thermochemical etching or electrochemical etching. A preferred method for roughening the surface of aluminum is the electrochemical process. The web is adjacent to electrodes and an alternating current is run from the electrodes to the web through and acid electrolyte. Most commonly hydrochloric acid or nitric acid is used. This results in the texturing of the surface by the controlled dissolution of aluminum at the surface. The roughened surface is rinsed. Aluminum is a relatively soft metal. Therefore it is common to harden the surface of the aluminum through an anodizing process. This process uses direct current wherein the aluminum is made the anode. Current is passed through an electrolyte to form aluminum oxide on the surface. Sulfuric acid or phosphoric acid is most commonly used in this process. The oxide weight is preferred to be greater than 1.0 g/M². The rinsed surface is finally rendered hydrophilic so as to permit acceptable performance in the printing process. The background, or non-image area must accept water and repel ink. Conversely the image must accept ink and repel water. The surface is rendered hydrophilic through the use of a thermochemical process or electrochemical process. Agents most commonly used are silicates of alkaline metals, phosphate salts, and homopolymers and copolymers of vinyl phosphonic acid. The surface is then coated with both coatings and is ready to be exposed.

A plate is preferably placed on an imagesetter for imaging. Image setters may output at a variety of wavelengths. They may output in the UV, visible and infrared portions of the electromagnetic spectrum. Recently much has been done with systems responsive in the infrared portion. More recently there has been a move to the blue (400-410 nm) region due to the advent of relatively inexpensive laser diodes emitting up to 30 mW. Image setters on the market are moving away from a laser diode array for cost and efficiency reasons. By not using an array however, the reduced power to the plate requires that an acceptable plate must have inherently very high sensitivities. Whereas heretofore plate energy requirements were in the range of 100-200 µJ/cm², with a blue laser diode as the energy and imaging source, coatings now have to image acceptably with 20-50 µJ/cm².

Escher-Grad produces the Cobalt 4 unit which is an imagesetter emitting in the blue region. Of 30 milliwatts at the laser source, there is an energy loss through fiber optics. Approximately half, or 15 milliwatts is available to image the plate. It is a single laser diode unit. Therefore, a plate to be successfully imaged will need no more than 50 µJ/cm². 35 µJ/cm² is required to make a commercially acceptable product that would fit comfortably into a useable range.

The imaged plate is then transported to an oven for the purpose of heating the plate. This heat continues the reaction initiated by the laser exposure and insures completion of the reaction necessary to yield a robust image. Heating is important but not critical as to the time/temperature relationship. There is a point where reciprocity failure will occur. A preferred temperature is 100° C. for 20-40 seconds. A temperature of 120° C. for 12-24 seconds is also useful. One skilled in the art will recognize the relationship and be able to adjust accordingly. The imaged plate is water rinsed to remove the barrier layer. The plate is then developed wherein the unexposed portion of the coating is removed and the exposed portion remains and corresponds to the digitized information that was used to pulse the laser diode in the imaging process. The plate is then rinsed and treated with a finisher. The finisher retains the image and background characteristics until the plate is placed on a press for printing.

The following examples are illustrative of the invention:

Example 1

A coating solution was prepared by dissolving 6.3 gr of an acrylic copolymer binder (17% methacrylic acid, 83% methylmethacrylate) in 82.7 gr of ethylene glycol monomethyl ether. When the polymer was fully dissolved 8.7 gr of dipentaerythritol monohydroxypentaacrylate were added along with 1.7 gr of a titanocene radiation absorber sold by Ciga Geigy as Irgacure 784 and 3.8 gr of methacryloxypropyl trimethoxy silane. The coating was spin-coated on an aluminum substrate that was electrochemically grained in hydrochloric acid, anodized using sulfuric acid and post treated with polyvinyl phosphonic acid. The plate was dried for at 100° C. for 60" and overcoated with 10% solution of polyvinyl alcohol (Mowitol 2-88). The first coat was 1.25 g/M² and the overcoat was 2.4 g/M². The plate was imaged on an Escher-Grad Colbalt 4 unit using approximately 40 µJ/cm². The imaged plate was heat treated at 100° C. for 20 seconds. The overcoat was removed through water rinsing. The plate was then developed using the standard negative plate developer produced by I.B.F. An image was observed which quickly washed away. There was no coating remaining on the plate surface after close inspection.

Example 2

A plate was similarly prepared as described in Example 1 except that in addition to the given ingredients, 0.40 gr of 2-mercaptobenzothiazole was added. The plate was similarly coated, imaged and processed. Upon development an image was observed. The continuous density read a solid 1. The 150 line halftone scale gave 5% dots to 95% screen. The benefit of using a photoaccelerator was immediately seen.

Example 3

A plate was similarly prepared as described in Example 1 except that in addition to the given ingredients, 0.10 gr of tolyliodotolyl hexafluorophosphate was added. The plate was similarly coated, imaged and processed. Upon development an image was observed. The continuous density read a solid 1. The 150 line halftone scale gave 10% dots to 97% screen. The benefit of using an onium compound was immediately seen.

Example 4

A plate was similarly prepared as described in Example 1 except that in addition to the given ingredients, 0.10 gr of diphenyliodonium hexafluorophosphate and 0.40 gr of 2-mercaptobenzoxazole were added. The plate was similarly coated, imaged and processed. Upon development an image was observed. The continuous density read a solid 9. The 150 line halftone scale gave 1.0% dots to 90% screen. The benefit of using an onium compound in combination with a photoaccelerator was unexpected and surprising.

Example 5

A plate was similarly prepared as described in Example 4 except that the acrylic copolymer used as the binder was substituted with 6.3 gr of a polymer made with 17% methacrylic acid, 20% hydroxyethylmethacrylate and 63% methylmethacrylate. The polymer being subsequently reacted with 20% acryloyl chloride to render the polymer now light sensitive. The plate was similarly coated, imaged and processed. Upon development a strong image was observed. The continuous density read a solid 12. The 150 line halftone scale gave 0.5% dots to 85% screen. It was observed that the use of a light sensitive polymer becoming integrated with the crosslinking was highly advantageous over an inert polymer having no light sensitivity.

Example 6

A coating solution was prepared according to the follow:

| INGREDIENT | AMOUNT (gr) |
| --- | --- |
| Binder resin from Example 5 | 6.50 |
| Pentaerythritol tetraacrylate | 8.50 |
| Methacryloxypropyl trimethoxy silane | 3.80 |
| Irgacure 784 | 1.70 |
| Dimethylamino benzoate | 0.50 |
| 2-mercaptobenzimidthiazole | 0.40 |
| diphenyliodonium hexafluorophosphate | 0.01 |

-continued

| INGREDIENT | AMOUNT (gr) |
|---|---|
| Flexo Blue 636 | 0.06 |
| 2-methoxy propanol | 78.53 |

The solution was spin coated on the same aluminum surface as described in Example 1, similarly overcoated and dried. The plate was likewise imaged and processed. With the presence of a dye, the image was easier to see and to read. The plate yielded a solid 8 and 1% to 90% with the 150 line halftone. The results were essentially the same as those of Example 4, thereby showing that the inclusion of a dye did not adversely affect the performance and speed. Also the substitution of an alternative photoaccelerator and photomonomer did not change the high photospeed and resolution.

The solution was spin coated on the same aluminum surface as described in Example 1, similarly overcoated and dried. The plate was likewise imaged and processed. With the presence of a dye, the image was easier to see and to read. The plate yielded a solid 8 and 1% to 90% with the 150 line halftone. The results were essentially the same as those of Example 4, thereby showing that the inclusion of a dye did not adversely affect the performance and speed. Also the substitution of an alternative photoaccelerator and photomonomer did not change the high photospeed and resolution.

What is claimed is:

1. A radiation sensitive material, characterized in that it comprises a metal substrate and two layers (1) and (2) built thereon in the stated sequence,
    wherein the first layer (1) comprises a radiation sensitive composition comprising:
    (a) a polymeric binder;
    (b) an ethylenically unsaturated monomer having functionality of three or more;
    (c) a radiation absorbing compound;
    (d) a photoaccelerator selected from the group consisting of 2-mercaptobenzothiazole and 2-mercaptobenzoxazol;
    (e) an onium compound; and
    (f) an adhesion promoter, wherein the weight ratio of the photoaccelerator to the onium compound is from 20:1 to 4:1;
    and the second layer (2) comprises a slight to non-oxygen permeable polymer.

2. The material according to claim 1, characterized in that
    said polymeric binder is present in an amount of from about 10 to about 80 wt %,
    said ethylenically unsaturated monomer is present in an amount of from about 5 to about 85 wt %,
    said radiation absorbing compound is present in an amount of from about 1 to about 25 wt %,
    said photoaccelerator is present in an amount of from about 0.1 to about 15 wt %,
    said onium compound is present in an amount of from about 0.01 to about 8 wt %, and
    said adhesion promoter is present in an amount of from about 1 to about 35 wt %,
    each based on the dry weight of said composition.

3. The material according to claim 1, characterized in that said polymeric binder comprises one of:
    (i) a copolymer which is selected from the group consisting of (meth)acrylic acid with alkyl(meth)acrylates, alkenyl (meth)acrylates, aryl(meth)acrylates, alkylaryl(meth) acrylates, (meth)acrylonitrile and mixtures thereof;
    (ii) a terpolymer which is selected from the group consisting of (meth)acrylic acid with alkyl(meth)acrylates, alkenyl(meth)acrylates, aryl(meth)acrylates, alkylaryl (meth)acrylates, (meth)acrylonitrile, styrene and optionally substituted styrenes, vinyl acetate and mixtures thereof;
    (iii) a tetra or pentapolymer which is selected from the group consisting of (meth)acrylic acid with alkyl(meth) acrylates, alkenyl(meth)acrylates, aryl(meth)acrylates, alkylaryl(meth)acrylates, (meth)acrylonitrile, styrene and optionally substituted styrenes, vinyl acetate and mixtures thereof;
    (iv) a copolymer of vinylacetic acid with alkyl(meth)acrylates and/or alkenyl(meth)acrylates;
    (v) a product of esterification of a polymer containing a hydroxyl group with an anhydride of a di- or polycarboxylic acid which is selected from the group consisting of copolymers of hydroxyalkyl(meth)acrylates with (meth)acrylic acid, alkyl(meth)acrylates, alkenyl(meth) acrylates, aryl(meth)acrylates, alkylaryl(meth)acrylates, (meth)acrylonitrile, styrene and optionally substituted styrenes, vinyl acetate and mixtures thereof;
    (vi) a product of esterification of a polymer containing a hydroxyl group with an acid chloride which is selected from the group consisting of copolymers of hydroxyalkyl(meth)acrylates with (meth)acrylic acid, alkyl (meth)acrylates, alkenyl(meth)acrylates, aryl(meth) acrylates, alkylaryl(meth)acrylates, (meth)acrylonitrile, styrene and optionally substituted styrenes, vinyl acetate and mixtures thereof; and
    (vii) a polyalkyl(meth)acrylates in which the alkyl group is methyl, ethyl, isopropyl, n-propyl, isobutyl, n-butyl, n-hexyl, 2-ethylhexyl and mixtures thereof.

4. The material according to claim 3, characterized in that said polymeric binder has a molecular weight from about 1,000 to about 300,000.

5. The material according to claim 1, characterized in that said ethylenically unsaturated monomer is selected from the group consisting of acrylates and methacrylates of trihydric or polyhydric aliphatic alcohols, trimethylol propane, pentaerylthritol, dipentaerythritol, methacrylate esters, acrylate esters and mixtures thereof.

6. The material according to claim 1, characterized in that said radiation absorbing compound comprises one of:
    (i) a titanocene which is selected from the group consisting of dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5, 6-tetrafluorophen-1-yl, dicyclopentadienyl-Ti-bis-2,4, 6-tetrafluorophen-1-yl, dicyclopentadienyl-Ti-bis-2,6-difluorophen-1-yl, dicyclopentadienyl-Ti-bis-2,4-difluorophen-1-yl, dicyclopentadienyl-Ti-bis-(2,5-difluoro-3-(3-pyrr-1-yl)phen-1-yl), dimethylcyclopentadienyl-Ti-bis-2,3,4,5,6-15 pentafluorophen-1-yl, dimethylcyclopentadienyl-Ti-bis-2, 6-15 difluorophen-1-yl and mixtures thereof;
    (ii) a hexaarylbiimidazole which is selected from the group consisting of 2,2'-bis(o-chlorophenyl)-4,4',5,5',-tetra(p-fluorophenyl)biimidazole, 2,2'-bis(o-chlorophenyl)-4, 4',5,5',-tetra(p-chlorophenyl)biimidazole, 2,2'-bis(o-chlorophenyl)-4,4',5,5',-tetra(o-chlorophenyl) biimidazole, 2,2'-bis(o-chlorophenyl)-4,4',5,5',-tetra(o, p-dichlorophenyl)biimidazole, 2,2'-bis(o-chlorophenyl)-4,4',5,5',-tetra(o,p-dibromophenyl) biimidazole and mixtures thereof; and
    (iii) a halomethyl substituted triazine which is selected from the group consisting of tris-trichlormethyl-s-triazine, bis-trichloromethyl-s-triazine, tris-trifluoromethyl-s-triazine and mixtures thereof.

7. The material according to claim 1, characterized in that said onium compound is selected from the group consisting of ammonium, arsonium, bismuthonium, bromonium, chloronium, diazonium, fluoronium, iodonium, oxonium, phosphonium, selenonium, stilonium, sulfonium, telluronium and mixtures thereof.

8. The material according to claim 7, characterized in that said onium compound is selected from the group consisting of 3-methoxy-4-diazo hexafluorophosphate, 3-methoxy-4-diazo hexafluoroantimonate, diphenyl iodonium chloride, diphenyl iodonium hexafluorophosphate, diphenyl iodonium hexafluoroantimonate, bis(4-t-butylphenyl)hexafluorophosphate, bis(4-methylphenyl)hexafluoroantimonate, triaryl sulfonium hexafluoroantimonate, triaryl sulfonium hexafluorophosphate, [4-[(2-hydroxytetradecyl)oxy]phenyl] phenyliodonium hexafluoroantimonate and mixtures thereof.

9. The material according to claim 1, characterized in that said adhesion promoter is a functionalized silane which is selected from the group consisting of 3-aminopropyltriethoxy silane, vinyltriethoxy silane, N-2-aminoethyl-3-aminopropyltrimethoxy silane, triethylchloro silane, methacryloxypropyl trimethoxy silane, methyltriethoxy silane, octyltriethoxy silane, triethylchloro silane, chloromethyltrimethyl silane and mixtures thereof.

10. The material according to claim 1 characterized in that the substrate is a textured and anodized aluminum plate.

11. The material according to claim 1, characterized in that the material further comprises stabilizers, photoactivators, colorants, rheology modifiers and additives.

12. The material according to claim 1, wherein the weight ratio of the photoaccelerator to the onium compound is from 8:1 to 4:1.

13. The material according to claim 1, wherein the weight ratio of the photoaccelerator to the onium compound is 4:1.

14. The material according to claim 1, wherein the photoaccelerator is 2-mercaptobenzothiazole.

15. The material according to claim 14, wherein the weight ratio of the photoaccelerator to the onium compound is from 8:1 to 4:1.

16. The material according to claim 15, wherein the onium compound is dipheniliodonium hexafluorophosphate.

17. The material according to claim 1, wherein the photoaccelerator is 2-mercaptobenzoxazol.

18. Material according to claim 17, wherein the weight ratio of the photoaccelerator to the onium compound is from 8:1 to 4:1.

19. The material according to claim 18, wherein the onium compound is dipheniliodonium hexafluorophosphate.

20. A process for preparing an image, characterized in that it comprises:
(i) providing an imaging layer coated on an aluminum support material, said imaging layer comprising a mixture of:
(a) a polymeric binder;
(b) an ethylenically unsaturated monomer having functionality of three or more;
(c) a radiation absorbing compound;
(d) a photoaccelerator selected from the group consisting of 2-mercaptobenzothiazole and 2-mercaptobenzoxazol;
(e) an onium compound; and
(f) an adhesion promoter, wherein the weight ratio of the photoaccelerator to the onium compound is from 20:1 to 4:1;
and an overcoated layer acting as an oxygen barrier layer;
(ii) generating an exposed plate by imagewise exposing an imaging area to an energy source emitting a laser beam in the blue wavelength sufficient to at least partially insolublize the irradiated area and form an exposed latent image, initiating the photochemical reaction;
(iii) treating the exposed plate with a temperature in the range of 100 to 120° C. and for a time of 12 to 40 seconds to complete the chemical cross-linking reaction and form a fully insolubilize image; and
(iv) removing the overcoated layer with water; and
(v) contacting said image area with developer material wherein the unexposed areas of said imaging layer are selectively removed from said support.

21. The process according to claim 20, wherein the weight ratio of the photoaccelerator to the onium compound is from 8:1 to 4:1.

22. The process according to claim 20, wherein the weight ratio of the photoaccelerator to the onium compound is 4:1.

23. A photopolymerizable layer composition consisting essentially of:
(a) a polymeric binder;
(b) an ethylenically unsaturated monomer having functionality of three or more;
(c) a radiation absorbing compound;
(d) a photoaccelerator selected from the group consisting of 2-mercaptobenzothiazole and 2-mercaptobenzoxazol;
(e) an onium compound; and
(f) an adhesion promoter, wherein the weight ratio of the photoaccelerator to the onium compound is from 20:1 to 4:1.

24. The composition according to claim 23, characterized in that
said polymeric binder is present in an amount of from about 10 to about 80 wt %,
said ethylenically unsaturated monomer is present in an amount of from about 5 to about 85 wt %,
said radiation absorbing compound is present in an amount of from about 1 to about 25 wt %,
said photoaccelerator is present in an amount of from about 0.1 to about 15 wt %,
said onium compound is present in an amount of from about 0.01 to about 8 wt %, and
said adhesion promoter is present in an amount of from about 1 to about 35 wt %,
each based on the dry weight of said composition.

25. The composition according to claim 23, characterized in that said polymeric binder comprises one of:
(i) a copolymer which is selected from the group consisting of (meth)acrylic acid with alkyl(meth)acrylates, alkenyl (meth)acrylates, aryl(meth)acrylates, alkylaryl(meth) acrylates, (meth)acrylonitrile and mixtures thereof;
(ii) a terpolymer which is selected from the group consisting of (meth)acrylic acid with alkyl(meth)acrylates, alkenyl(meth)acrylates, aryl(meth)acrylates, alkylaryl (meth)acrylates, (meth)acrylonitrile, styrene and optionally substituted styrenes, vinyl acetate and mixtures thereof;
(iii) a tetra or pentapolymer which is selected from the group consisting of (meth)acrylic acid with alkyl(meth) acrylates, alkenyl(meth)acrylates, aryl(meth)acrylates, alkylaryl(meth)acrylates, (meth)acrylonitrile, styrene and optionally substituted styrenes, vinyl acetate and mixtures thereof;
(iv) a copolymer of vinylacetic acid with alkyl(meth)acrylates and/or alkenyl(meth)acrylates;

(v) a product of esterification of a polymer containing a hydroxyl group with an anhydride of a di- or polycarboxylic acid which is selected from the group consisting of copolymers of hydroxyalkyl(meth)acrylates with (meth)acrylic acid, alkyl(meth)acrylates, alkenyl(meth)acrylates, aryl(meth)acrylates, alkylaryl(meth)acrylates, (meth)acrylonitrile, styrene and optionally substituted styrenes, vinyl acetate and mixtures thereof;

(vi) a product of esterification of a polymer containing a hydroxyl group with an acid chloride which is selected from the group consisting of copolymers of hydroxyalkyl(meth)acrylates with (meth)acrylic acid, alkyl (meth)acrylates, alkenyl(meth)acrylates, aryl(meth)acrylates, alkylaryl(meth)acrylates, (meth)acrylonitrile, styrene and optionally substituted styrenes, vinyl acetate and mixtures thereof; and (vii) a polyalkyl(meth)acrylates in which the alkyl group is methyl, ethyl, isopropyl, n-propyl, isobutyl, n-butyl, n-hexyl, 2-ethylhexyl and mixtures thereof.

26. The composition according to claim 23, characterized in that said polymeric binder has a molecular weight from about 1,000 to about 300,000.

27. The composition according to claim 23, characterized in that said ethylenically unsaturated monomer is selected from the group consisting of acrylates and methacrylates of trihydric or polyhydric aliphatic alcohols, trimethylol propane, pentaerylthritol, dipentaerythritol, methacrylate esters, acrylate esters and mixtures thereof.

28. The composition according to claim 23, characterized in that said radiation absorbing compound comprises one of:
(i) a titanocene which is selected from the group consisting of dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5, 6-tetrafluorophen-1-yl, dicyclopentadienyl-Ti-bis-2,4, 6-tetrafluorophen-1-yl, dicyclopentadienyl-Ti-bis-2,6-difluorophen-1-yl, dicyclopentadienyl-Ti-bis-2,4-difluorophen-1-yl, dicyclopentadienyl-Ti-bis-(2,5-difluoro-3-(3-pyrr-1-yl)phen-1-yl), dimethylcyclopentadienyl-Ti-bis-2,3,4,5,6-15 pentafluorophen-1-yl, dimethylcyclopentadienyl-Ti-bis-2, 6-15 difluorophen-1-yl and mixtures thereof;
(ii) a hexaarylbiimidazole which is selected from the group consisting of 2,2'-bis(o-chlorophenyl)-4,4',5,5',-tetra(p-fluorophenyl)biimidazole, 2,2'-bis(o-chlorophenyl)-4, 4',5,5',-tetra(p-chlorophenyl)biimidazole, 2,2'-bis(o-chlorophenyl)-4,4',5,5',-tetra(o-chlorophenyl) biimidazole, 2,2'-bis(o-chlorophenyl)-4,4',5,5',-tetra(o, p-dichlorophenyl)biimidazole, 2,2'-bis(o-chlorophenyl)-4,4',5,5',-tetra(o,p-dibromophenyl) biimidazole and mixtures thereof; and
(iii) a halomethyl substituted triazine which is selected from the group consisting of tris-trichlormethyl-s-triazine, bis-trichloromethyl-s-triazine, tris-trifluoromethyl-s-triazine and mixtures thereof.

29. The composition according to claim 23, characterized in that said onium compound is selected from the group consisting of ammonium, arsonium, bismuthonium, bromonium, chloronium, diazonium, fluoronium, iodonium, oxonium, phosphonium, selenonium, stilonium, sulfonium, telluronium and mixtures thereof.

30. The composition according to claim 29, characterized in that said onium compound is selected from the group consisting of 3-methoxy-4-diazo hexafluorophosphate, are 3-methoxy-4-diazo hexafluoroantimonate, diphenyl iodonium chloride, diphenyl iodonium hexafluorophosphate, diphenyl iodonium hexafluoroantimonate, bis(4-t-butylphenyl)hexafluorophosphate, bis(4-methylphenyl)hexafluoroantimonate, triaryl sulfonium hexafluoroantimonate, triaryl sulfonium hexafluorophosphate, [4-[(2-hydroxytetradecyl)oxy]phenyl]phenyliodonium hexafluoroantimonate and mixtures thereof.

31. The composition according to claim 23, characterized in that said adhesion promoter is a functionalized silane which is selected from the group consisting of 3-aminopropyltriethoxy silane, vinyltriethoxy silane, N-2-aminoethyl-3-aminopropyltrimethoxy silane, triethylchloro silane, methacryloxypropyl trimethoxy silane, methyltriethoxy silane, octyltriethoxy silane, triethylchloro silane, chloromethyltrimethyl silane and mixtures thereof.

32. The composition of claim 23 wherein component (a) is present at a level of about 15-70 wt %, component (b) is present at a level of about 15-70 wt %, component (c) is present at a level of about 3-20 wt %, component (d) is present at a level of about 0.5-10 wt %, component (e) is present at a level of about 0.05-5 wt %, component (f) is present at a level of about 5-30 wt %, each based on the dry weight of said composition.

33. The composition of claim 23 wherein component (a) is present at a level of about 20-55 wt %, component (b) is present at a level of about 25-60 wt %, component (c) is present at a level of about 5-15 wt %, component (d) is present at a level of about 1-8 wt %, component (e) is present at a level of about 0.1-3 wt %, component (f) is present at a level of about 10-20 wt %, each based on the dry weight of said composition.

34. The composition of claim 23 wherein it is used in the preparation of an imaging layer on a support which is capable of functioning in a negative-working manner; said support comprising an aluminum printing plate.

35. The composition according to claim 23, wherein the weight ratio of the photoaccelerator to the onium compound is from 8:1 to 4:1.

36. The composition according to claim 23, wherein the weight ratio of the photoaccelerator to the onium compound is 4:1.

37. A radiation sensitive material, characterized in that it comprises a metal substrate and two layers (1) and (2) built thereon in the stated sequence, wherein the first layer (1) comprises a radiation sensitive composition comprising:
(a) a polymeric binder;
(b) an ethylenically unsaturated monomer having functionality of three or more;
(c) a radiation absorbing compound;
(d) a photoaccelerator selected from the group consisting of 2-mercaptobenzothiazole and 2-mercaptobenzoxazol;
(e) an onium compound; and
(f) an adhesion promoter reactive with both the substrate and the second layer, wherein the weight ratio of the photoaccelerator to the onium compound is from 20:1 to 4:1;
and the second layer (2) comprises a slight to non-oxygen permeable polymer;
such that the material exhibits an improved sensitivity to radiation.

38. The radiation sensitive material according to claim 37, wherein the weight ratio of the photoaccelerator to the onium compound is from 8:1 to 4:1.

39. The radiation sensitive material according to claim 37, wherein the weight ratio of the photoaccelerator to the onium compound is 4:1.

40. A radiation sensitive material, characterized in that it consists essentially of a metal substrate and two layers (1) and (2) built thereon in the stated sequence,
wherein the first layer (1) comprises a radiation sensitive composition comprising:
(a) a polymeric binder;
(b) an ethylenically unsaturated monomer having functionality of three or more;
(c) a radiation absorbing compound;
(d) a photoaccelerator selected from the group consisting of 2-mercaptobenzothiazole and 2-mercaptobenzoxazol;
(e) an onium compound; and
(f) an adhesion promoter, wherein the weight ratio of the photoaccelerator to the onium compound is from 20:1 to 4:1;
and the second layer (2) comprises a slight to non-oxygen permeable polymer.

41. The radiation sensitive material according to claim 40, wherein the weight ratio of the photoaccelerator to the onium compound is from 8:1 to 4:1.

42. The radiation sensitive material according to claim 40, wherein the weight ratio of the photoaccelerator to the onium compound is 4:1.

43. A photopolymerizable layer composition consisting essentially of:
(a) a polymeric binder;
(b) an ethylenically unsaturated monomer having functionality of three or more;
(c) a radiation absorbing compound;
(d) a photoaccelerator selected from the group consisting of 2-mercaptobenzothiazole and 2-mercaptobenzoxazol;
(e) an onium compound; and
(f) an adhesion promoter, wherein the weight ratio of the photoaccelerator to the onium compound is from 20:1 to 4:1, and wherein;
the radiation absorbing compound is a titanocene which is selected from the group consisting of dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-tetrafluorophen-1-yl, dicyclopentadienyl-Ti-bis-2,6-difluorophen-1-yl, dicyclopentadienyl-Ti-bis-2,4-difluorophen-1-yl, dicyclopentadienyl-Ti-bis-(2,5-difluoro-3-(3-pyrr-1-yl)phen-1-yl), dimethylcyclopentadienyl-Ti-bis-2,3,4,5,6-15 pentafluorophen-1-yl, dimethylcyclopentadienyl-Ti-bis-2,6-15 difluorophen-1-yl and mixtures thereof.

* * * * *

UNITED STATES PATENT AND TRADEMARK OFFICE
CERTIFICATE OF CORRECTION

PATENT NO.         : 8,741,536 B2                               Page 1 of 1
APPLICATION NO.    : 10/573368
DATED              : June 3, 2014
INVENTOR(S)        : Arias et al.

It is certified that error appears in the above-identified patent and that said Letters Patent is hereby corrected as shown below:

On the Title page:
Item (73) Assignee: "IBF Industria Basileira de Filmes S/A" should read
--IBF Industria Brasileira de Filmes S/A--.

In the claims:
Column 11,
Line 44, "Material" should read --The material--.

Signed and Sealed this
Twenty-third Day of September, 2014

Michelle K. Lee
*Deputy Director of the United States Patent and Trademark Office*